(12) United States Patent
Payer

(10) Patent No.: US 7,081,660 B2
(45) Date of Patent: Jul. 25, 2006

(54) HERMETIC PACKAGE WITH INTERNAL GROUND PADS

(75) Inventor: Robert L. Payer, Pepperell, MA (US)

(73) Assignee: Axsun Technologies, Inc., Billerica, MA (US)

( * ) Notice: Subject to any disclaimer, the term of this patent is extended or adjusted under 35 U.S.C. 154(b) by 764 days.

(21) Appl. No.: 09/884,844

(22) Filed: Jun. 19, 2001

(65) Prior Publication Data

US 2002/0190335 A1 Dec. 19, 2002

(51) Int. Cl.
*H01L 23/495* (2006.01)
*H01L 23/52* (2006.01)
*H01L 23/02* (2006.01)

(52) U.S. Cl. ............... 257/433; 257/432; 257/431; 257/678; 257/666; 257/690; 257/691; 257/692

(58) Field of Classification Search ............... 257/432, 257/431, 434, 417, 441, 439
See application file for complete search history.

(56) References Cited

U.S. PATENT DOCUMENTS

| | | | | |
|---|---|---|---|---|
| 5,065,226 A | * | 11/1991 | Kluitmans et al. | 257/433 |
| 5,222,170 A | * | 6/1993 | Bargar et al. | 385/88 |
| 5,508,556 A | * | 4/1996 | Lin | 257/691 |
| 6,414,835 B1 | * | 7/2002 | Wolf et al. | 361/302 |
| 2002/0070045 A1 | * | 6/2002 | Musk et al. | 174/52.4 |

* cited by examiner

Primary Examiner—Nathan J. Flynn
Assistant Examiner—Fazli Erdem
(74) Attorney, Agent, or Firm—Houston Eliseeva LLP

(57) ABSTRACT

An optoelectronic hermetic package comprises a frame defining a hermetic boundary and an electrical feedthrough assembly on the frame. This electrical feedthrough assembly provides electrical connections between signal wire bond areas within the hermetic boundary to electrical contact areas outside the hermetic boundary. Additionally, according to the invention, ground wire bond pad areas are also provided within the hermetic boundary, the ground wire bond pad areas being electrically connected to each other and/or the frame or other ground plane.

12 Claims, 3 Drawing Sheets

HERMETIC PACKAGE WITH INTERNAL GROUND PADS

BACKGROUND OF THE INVENTION

Most optoelectronic systems include hermetic packages. Active components such as semi-conductor lasers or other gain media typically perform better in a controlled atmosphere. Passive components, such as thin film dielectric filters are susceptible to humidity changes, for example.

The typical hermetic package comprises a frame defining the hermetic boundary. This frame typically includes a base, sidewalls, and a lid. The lid is typically welded or otherwise sealed to the tops of the sidewalls as one of the final steps in the packaging process.

The frames further typically comprise optical and electrical feedthroughs. The optical, or fiber, feedthroughs are usually in the form holes in the sidewalls of the frame that accommodate the insertion of fiber optic pigtails through the holes and into the packages. During manufacture, the optical fiber pigtails are installed onto optical benches, or submounts, within the frames. The electrical feedthrough typically comprises an assembly that provides mutually isolated electrical connections between wire bond areas within the frame and electrical contacts that are outside of the frame. Typically, dual in-line package (DIL) or butterfly style leads are then attached to the electrical contact areas to electrically connect the package to a circuit board, for example.

SUMMARY OF THE INVENTION

The trend toward higher levels of optical integration, especially in the context of hybrid optical integration, typically necessitates more electrical connections across the hermetic boundary of the package. For example, in modem designs, the optical systems within the hermetic boundary can comprise multiple detectors, active elements, and microelectromechanical system (MEMS) devices, which are installed together on a submount or optical bench. This trend toward higher optical integration strains the electrical feedthroughs of the packages.

In general, according to one aspect, the invention features an optoelectronic hermetic package. It comprises a frame defining a hermetic boundary and an electrical feedthrough assembly on the frame. This electrical feedthrough assembly provides electrical connections between signal wire bond areas within the hermetic boundary to electrical contact areas outside the hermetic boundary. Additionally, according to the invention, ground wire bond pad areas are also provided within the hermetic boundary, the ground wire bond pad areas being electrically connected to each other and/or the frame or other ground plane.

Some advantages of the invention are that the number of wire bond areas within the hermetic boundary is effectively increased by providing multiple contacts to the typically electrically grounded frame. This allows the signal wire bond areas to be used exclusively for non-ground electrical connections across the hermetic boundary.

In the illustrated embodiments, a butterfly-style package is shown. Alternatively, however, the present invention is also applicable to other package styles.

Preferably, the ground wire bond areas are located between two signal wire bond areas on the feedthrough assembly. The advantage here concerns the fact that electrical connections between the wire bond areas of the package and the optical bench metalizations and/or electronic components are usually made using wire bonding techniques. Crossing the wires can lead to intermittent shorting. Locating the ground wire bond areas between signal wire bond areas reduces the risk of wire crossing, especially when they are fully interdigitated.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
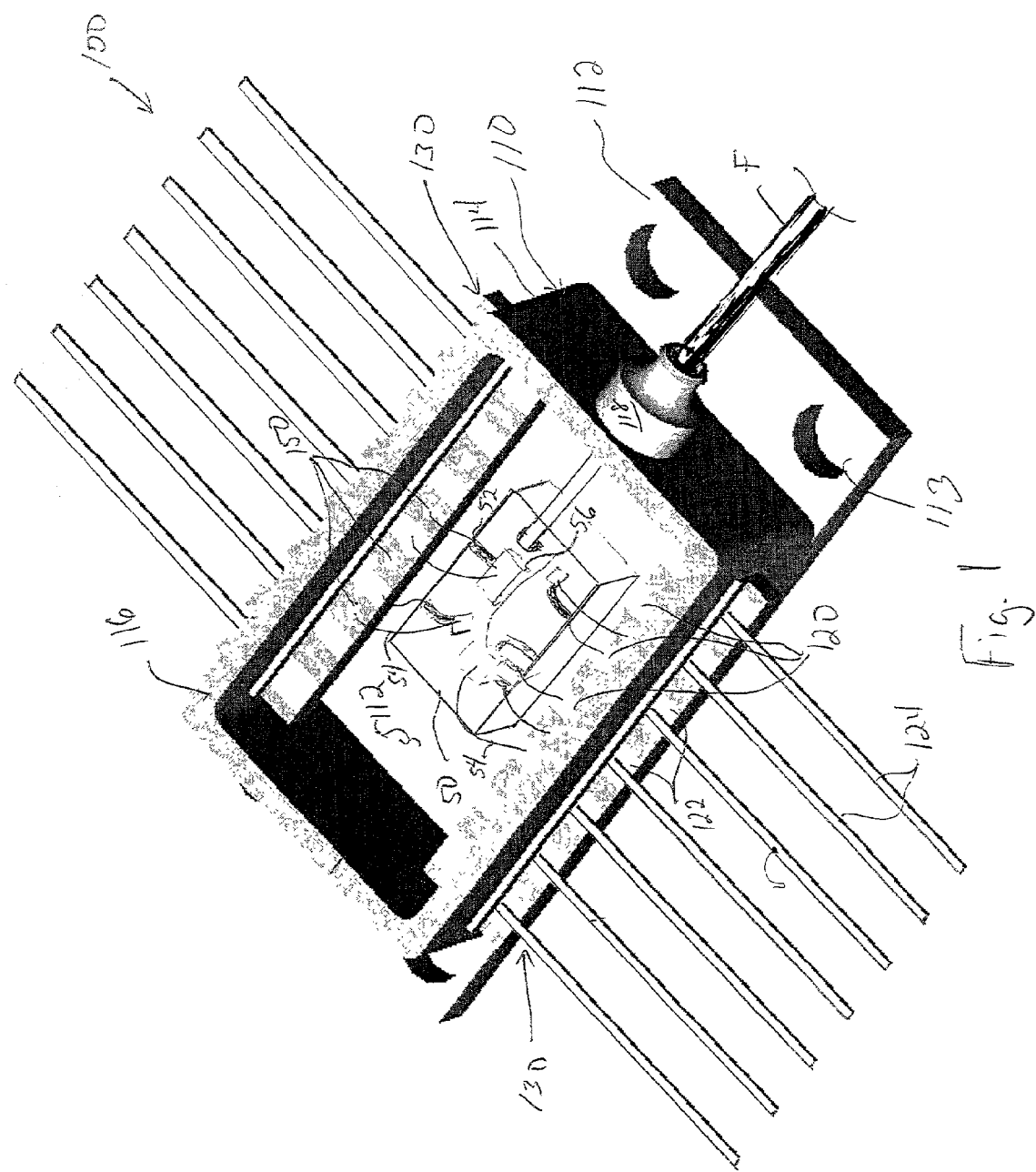
FIG. 1 is a perspective view of an optoelectronic hermetic package, with its lid removed, showing an optical bench installed within the package.

FIG. 1 shows an optoelectronic hermetic package, which has been constructed according to the principles of the present invention.

Specifically, the package 100 comprises a frame 110. This frame has a base 112. Holes 113 may be provided in the base 112 for securing the package to a circuit board, for example. The frame 110 further comprises sidewalls 114 projecting from the base 112 and defining a perimeter of the hermetic boundary. Finally, a lid (not shown) is welded or otherwise attached to the top 116 of the sidewalls 114 to seal the package.

The hermetic package 100 further comprises an optical feedthrough 118. In the typical implementation, this feedthrough is in the form of a ferruled hole in the sidewall 114. During manufacture, fiber f is inserted through the optical feedthrough 118 and typically secured to a bench 50, which is installed within the hermetic boundary of the package 100, sometimes on a thermoelectric cooler.

Installed on the optical bench 50 are hybrid components including optoelectronic components such as lasers, semiconductor optical amplifiers, detectors, and/or MEMS devices, in addition to electronic components, such as electronic amplifiers and thermistors, for example. Electrical contact to these components is typically provided via wire bond areas 52, which are connected to the components by metalizations on the bench itself or by direct bonding to the components. Typically, wire jumpers 54 extend between the bond areas 52 of the bench and/or the electronic components 56 and the wire bond areas 120, 130 of the feedthrough assembly 130.

According to the invention, ground wire bond areas 150 are additionally provided on the electrical feedthrough assembly. These areas are electrically connected to the package frame 110 or commonly to the same one of the pins or leads 124.

The signal wire bond areas 120 are electrically connected to contact areas 122 outside the hermetic boundary of the frame 110. In a typical implementation, arrays of pins 124 are connected to these electrical contact areas 122. The assembly 130 electrically connects each of the signal wire bond areas 120 to a separate one of the pins 124. Whereas, at least some of the ground wire bond areas 150 are electrically connected to each other and typically to either the frame or a designated one of the leads 124.

Figure 2:
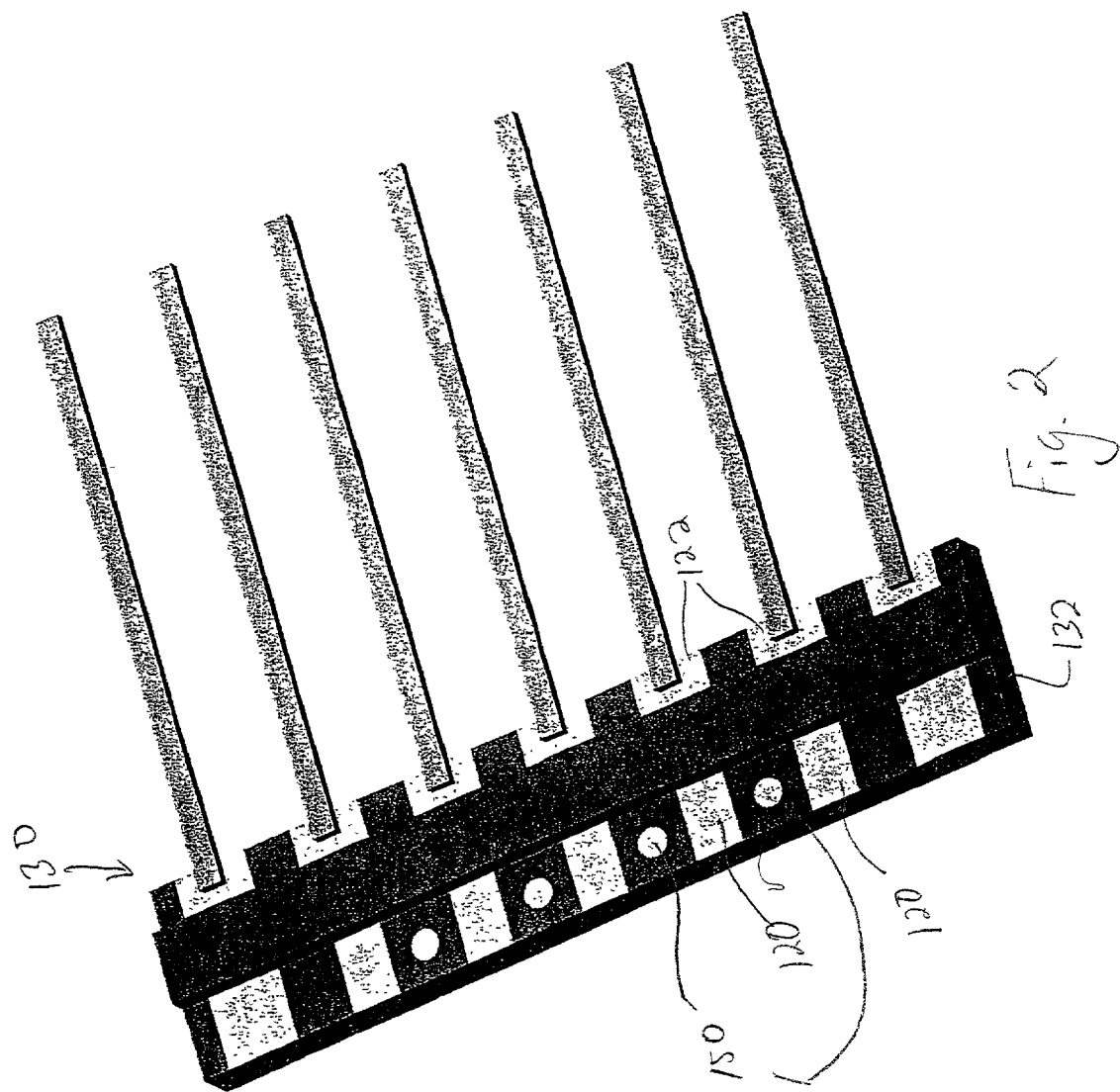
FIG. 2 is a perspective view of an electrical feedthrough assembly according to the present invention.

FIG. 2 better shows the electrical feedthrough assembly 130 of the present invention.

Typically, the bulk material 132 of the feedthrough assembly 130 is a ceramic or other stable, non-conductive substance. Metalizations are provided on this ceramic material to yield the signal wire bond areas 120 and the electrical contact areas 122 and in addition to the electrical connections between the respective wire bond areas and the electrical contact areas.

The ground wire bond areas 150 are preferably installed between adjacent signal wire bond areas 120. Preferably, they are fully interdigitated with a ground wire bond area being located between each adjacent signal wire bond area. This maximizes a number of potential electrical connections.

Figure 3:
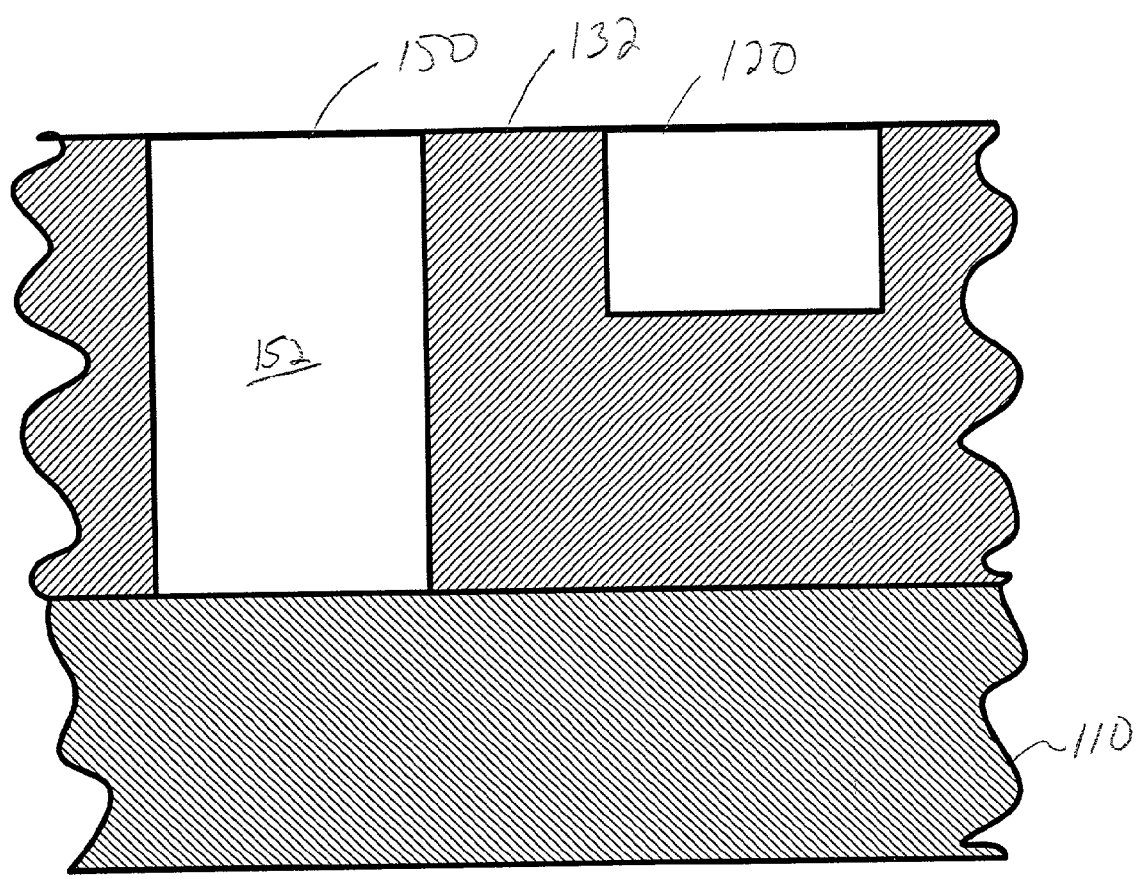
FIG. 3 is a partial cross-sectional view of the feedthrough assembly according to one implementation of the present invention.

FIG. 3 is a cross-sectional view showing the configuration of the signal wire bond areas and the ground wire bond areas. Specifically, the ground wire bond area 150 is provided at the top of plug 152 in the ceramic bulk material 132. These conductive plugs 152 extends between the ground wire bond area 150 and the frame 110 of the package.

In contrast, the signal wire bond areas 120 are isolated from the frame 110 via the ceramic insulator material 132.

In an alternative embodiment, a bus conductor extends between ground wire bond areas and one of the leads.

While this invention has been particularly shown and described with references to preferred embodiments thereof, it will be understood by those skilled in the art that various changes in form and details may be made therein without departing from the scope of the invention encompassed by the appended claims.

What is claimed is:

1. An optoelectronic hermetic package, comprising:
   a frame defining a hermetic boundary;
   an electrical feedthrough assembly on the frame including: 1) electrical connections between signal wire bond areas within the hermetic boundary and electrical contact areas outside the hermetic boundary; and 2) ground wire bond areas within the hermetic boundary that are electrically connected to each other; and
   conductive plugs extending between a top of the feedthrough assembly and the frame, the ground wire bond areas being located on a top of the conductive plugs.

2. A package as claimed in claim 1, further comprising an array of leads extending from electrical contact areas away from the frame.

3. A package as claimed in claim 2, wherein the leads extend laterally relative to the frame.

4. A package as claimed in claim 2, wherein the leads are pins that extend vertically relative to the frame.

5. A package as claimed in claim 1, wherein at least some of the ground wire bond areas are located between two of the signal wire bond areas on the feedthrough assembly.

6. A package as claimed in claim 1, wherein the ground wire bond areas are interdigitated with signal wire bond areas.

7. An optoelectronic hermetic package, comprising:
   a frame defining a hermetic boundary;
   an electrical feedthrough assembly on the frame including: 1) electrical connections between signal wire bond areas within the hermetic boundary and electrical contact areas outside the hermetic boundary: and 2) ground wire bond areas within the hermetic boundary that are electrically connected to each other; and
   conductive plugs extending between a top of the feedthrough assembly and a bus through the assembly, the ground wire bond areas being located on a top of the conductive plugs.

8. A package as claimed in claim 7, further comprising an array of leads extending from electrical contact areas away from the frame.

9. A package as claimed in claim 8, wherein the leads extend laterally relative to the frame.

10. A package as claimed in claim 8, wherein the leads are pins that extend vertically relative to the frame.

11. A package as claimed in claim 7, wherein at least some of the ground wire bond areas are located between two of the signal wire bond areas on the feedthrough assembly.

12. A package as claimed in claim 7, wherein the ground wire bond areas are interdigitated with signal wire bond areas.

* * * * *

UNITED STATES PATENT AND TRADEMARK OFFICE
CERTIFICATE OF CORRECTION

PATENT NO. : 7,081,660 B2
APPLICATION NO. : 09/884844
DATED : July 25, 2006
INVENTOR(S) : Robert L. Payer It is certified that error appears in the above-identified patent and that said Letters Patent is hereby corrected as shown below:

The title page showing the illustrative figure should be deleted to be replaced with the attached title page.

Drawing sheets, consisting of figs. 1, 2, and 3, should be deleted to be replaced with the drawing sheets, consisting of figs. 1, 2, and 3, as shown on the attached page.

Signed and Sealed this

Fourth Day of March, 2008

JON W. DUDAS
*Director of the United States Patent and Trademark Office*

(12) United States Patent
Payer

(10) Patent No.: US 7,081,660 B2
(45) Date of Patent: Jul. 25, 2006

(54) HERMETIC PACKAGE WITH INTERNAL GROUND PADS

(75) Inventor: Robert L. Payer, Pepperell, MA (US)

(73) Assignee: Axsun Technologies, Inc., Billerica, MA (US)

( * ) Notice: Subject to any disclaimer, the term of this patent is extended or adjusted under 35 U.S.C. 154(b) by 764 days.

(21) Appl. No.: 09/884,844

(22) Filed: Jun. 19, 2001

(65) Prior Publication Data
US 2002/0190335 A1 Dec. 19, 2002

(51) Int. Cl.
H01L 23/495 (2006.01)
H01L 23/52 (2006.01)
H01L 23/02 (2006.01)

(52) U.S. Cl. ............ 257/433; 257/432; 257/431; 257/678; 257/666; 257/690; 257/691; 257/692

(58) Field of Classification Search ........ 257/432, 257/431, 434, 417, 441, 439
See application file for complete search history.

(56) References Cited

U.S. PATENT DOCUMENTS

| 5,065,226 A | * | 11/1991 | Kluitmans et al. | 257/433 |
| 5,222,170 A | * | 6/1993 | Bargar et al. | 385/88 |
| 5,508,556 A | * | 4/1996 | Lin | 257/691 |
| 6,414,835 B1 | * | 7/2002 | Wolf et al. | 361/302 |
| 2002/0070045 A1 | * | 6/2002 | Musk et al. | 174/52.4 |

* cited by examiner

Primary Examiner—Nathan J. Flynn
Assistant Examiner—Fazli Erdem
(74) Attorney, Agent, or Firm—Houston Eliseeva LLP

(57) ABSTRACT

An optoelectronic hermetic package comprises a frame defining a hermetic boundary and an electrical feedthrough assembly on the frame. This electrical feedthrough assembly provides electrical connections between signal wire bond areas within the hermetic boundary to electrical contact areas outside the hermetic boundary. Additionally, according to the invention, ground wire bond pad areas are also provided within the hermetic boundary, the ground wire bond pad areas being electrically connected to each other and/or the frame or other ground plane.

12 Claims, 3 Drawing Sheets

UNITED STATES PATENT AND TRADEMARK OFFICE
CERTIFICATE OF CORRECTION

| | | |
|---|---|---|
| PATENT NO. | : 7,081,660 B2 | Page 3 of 5 |
| APPLICATION NO. | : 09/884844 | |
| DATED | : July 25, 2006 | |
| INVENTOR(S) | : Robert L. Payer | |

It is certified that error appears in the above-identified patent and that said Letters Patent is hereby corrected as shown below:

Delete Sheet 1 of 3 of the issued patent and replace with the following sheet 1 of 3:

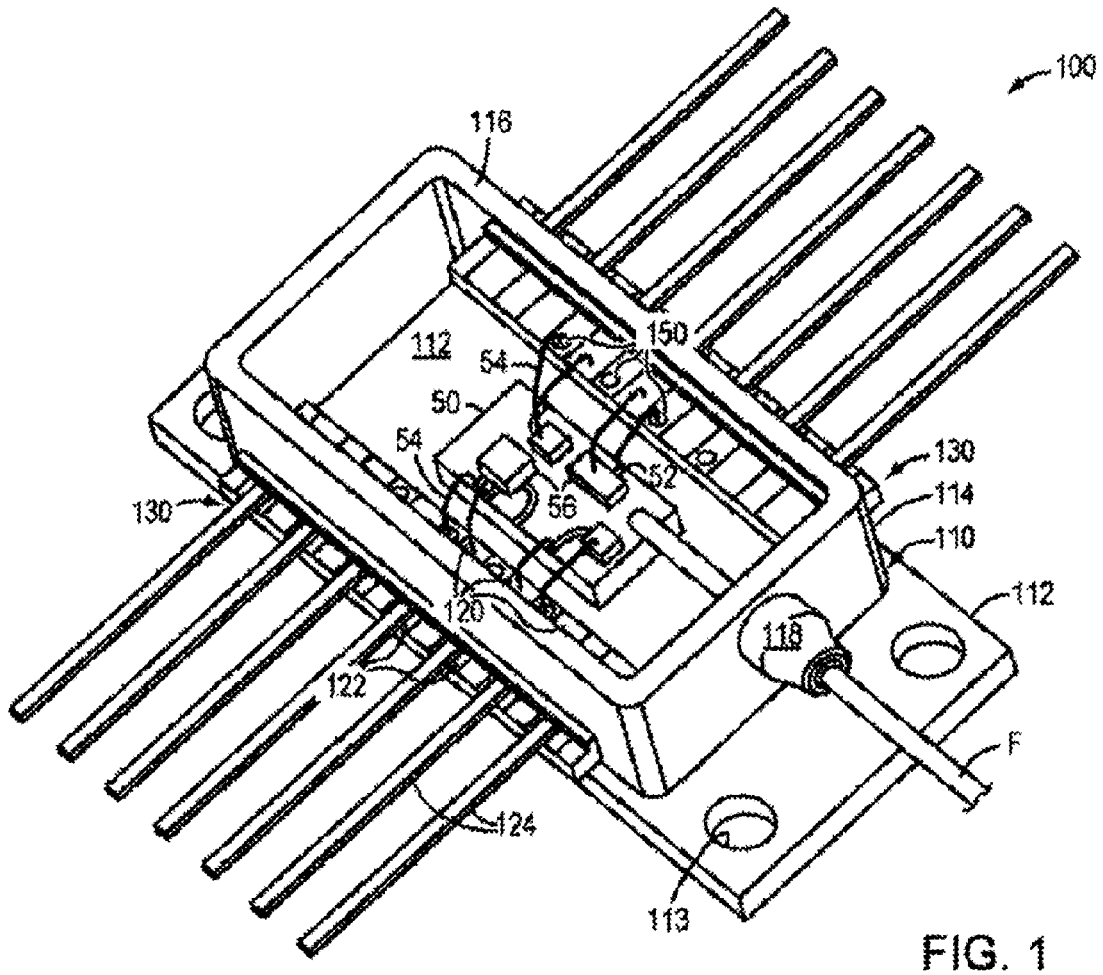

FIG. 1

UNITED STATES PATENT AND TRADEMARK OFFICE
CERTIFICATE OF CORRECTION

PATENT NO. : 7,081,660 B2  Page 4 of 5
APPLICATION NO. : 09/884844
DATED : July 25, 2006
INVENTOR(S) : Robert L. Payer It is certified that error appears in the above-identified patent and that said Letters Patent is hereby corrected as shown below:

Delete Sheet 2 of 3 of the issued patent and replace with the following Sheet 2 of 3:

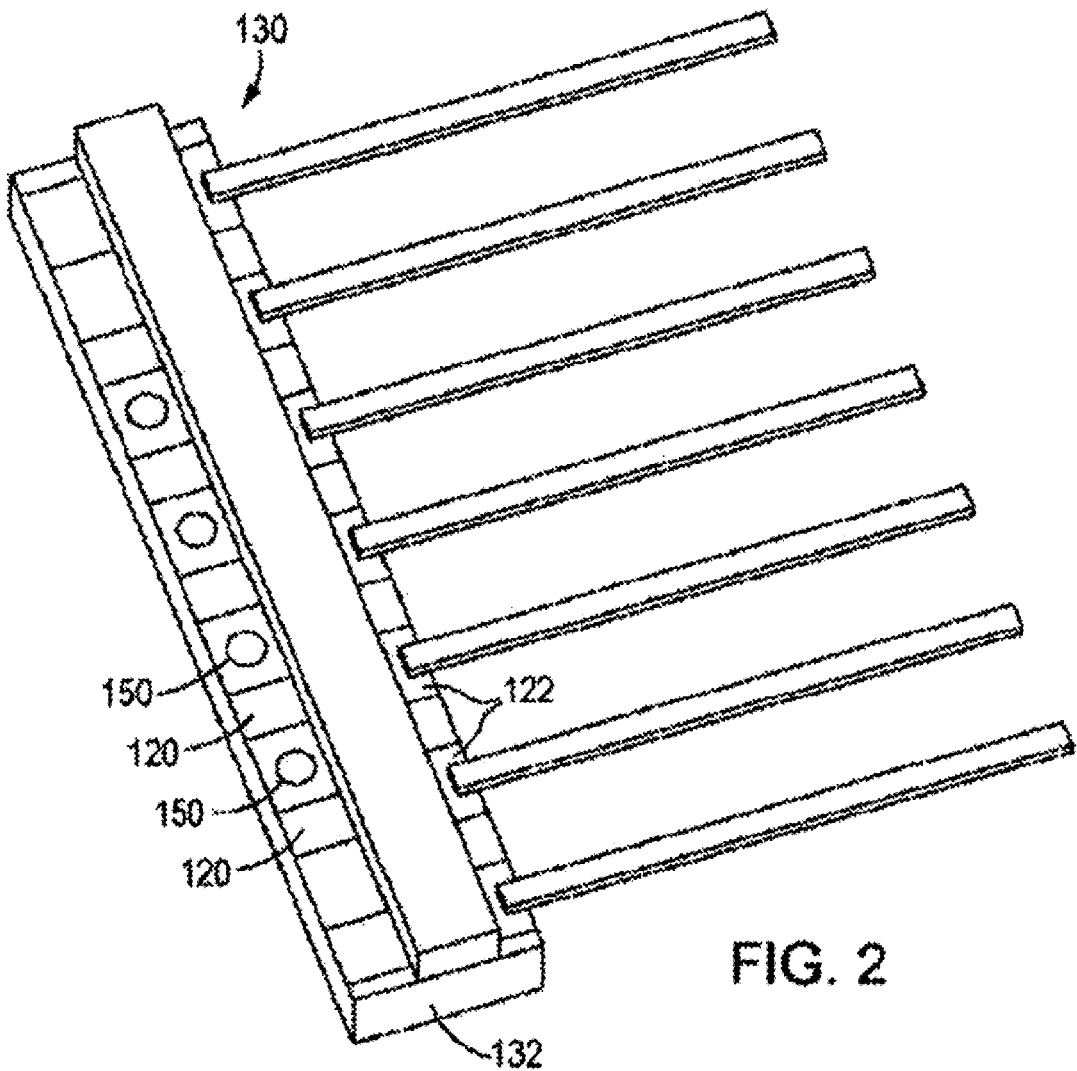

FIG. 2

UNITED STATES PATENT AND TRADEMARK OFFICE
CERTIFICATE OF CORRECTION

PATENT NO.      : 7,081,660 B2
APPLICATION NO. : 09/884844
DATED           : July 25, 2006
INVENTOR(S)     : Robert L. Payer It is certified that error appears in the above-identified patent and that said Letters Patent is hereby corrected as shown below:

Delete Sheet 3 of 3 of the issued patent and replace with the following sheet 3 of 3:

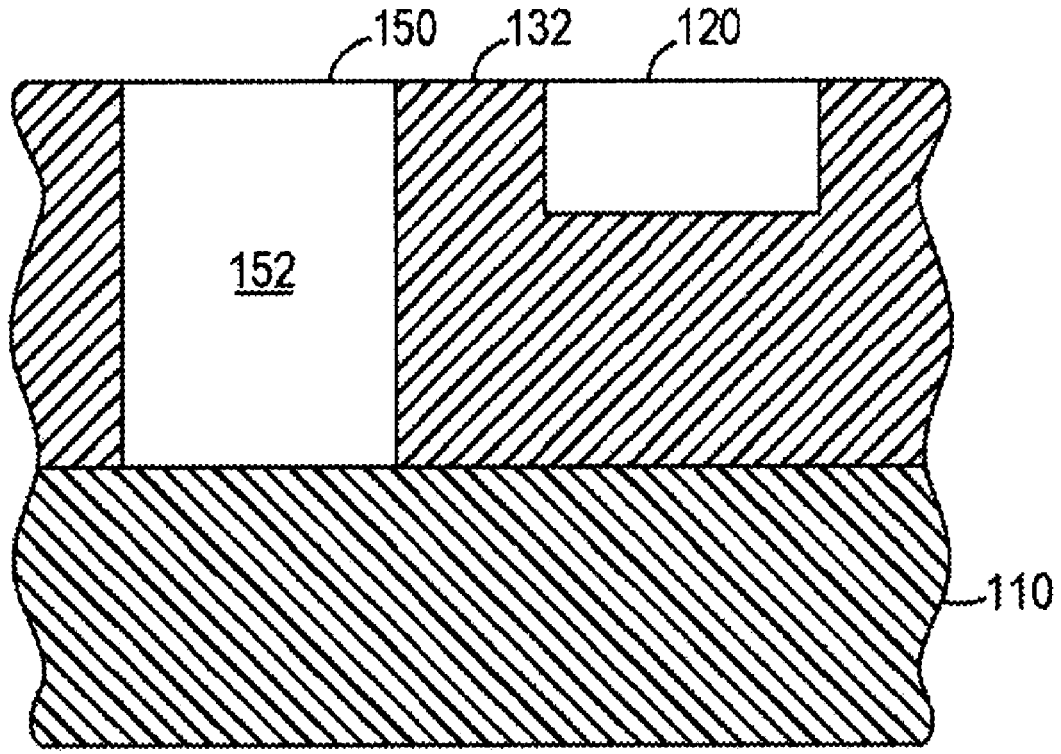

FIG. 3